(12) United States Patent
Wagner

(10) Patent No.: US 6,360,816 B1
(45) Date of Patent: Mar. 26, 2002

(54) COOLING APPARATUS FOR ELECTRONIC DEVICES

(75) Inventor: Guy R. Wagner, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/471,835

(22) Filed: Dec. 23, 1999

(51) Int. Cl.[7] ................................................. F24H 3/06
(52) U.S. Cl. ........................ 165/122; 165/80.3; 361/697
(58) Field of Search ........................... 165/80.37, 185, 165/121, 122; 361/697, 704

(56) References Cited

U.S. PATENT DOCUMENTS

| | | | |
|---|---|---|---|
| 2,289,984 A | * 7/1942 | Mouromtseff et al. | 165/80.3 |
| 2,413,179 A | * 12/1946 | Grandmont et al. | 165/80.3 |
| 2,680,009 A | * 6/1954 | Nekut | 165/80.3 |
| 2,936,409 A | 5/1960 | Jackson et al. | 317/234 |
| 3,033,537 A | * 5/1962 | Brown, Jr. | 165/80.3 |
| 3,193,003 A | * 7/1965 | McCuen | 165/80.3 |
| 3,372,733 A | * 3/1968 | Callender | 165/80.3 |
| 3,372,741 A | * 3/1968 | Kaiser et al. | 165/80.3 |
| 3,457,988 A | * 7/1969 | Meyerhoff et al. | 165/80.3 |
| 4,884,631 A | 12/1989 | Rippel | 165/185 |
| 5,409,352 A | 4/1995 | Lin | 415/177 |
| 5,504,650 A | 4/1996 | Katsui et al. | 361/697 |
| 5,582,240 A | 12/1996 | Widmayer | 165/80.3 |
| 5,694,295 A | 12/1997 | Mochizuki et al. | 361/699 |
| 5,785,116 A | 7/1998 | Wagner | 165/80.3 |
| 5,794,685 A | 8/1998 | Dean | 165/121 |
| 6,196,298 B1 | * 3/2001 | Shaw | 165/80.3 |

OTHER PUBLICATIONS

United State Patent Application Serial No. 09/253,877 filed Feb. 22, 1999 for "Cooling Apparatus For Electronic Devices" of Steven E. Hanzlik et al.

United States Patent Application Serial No. 09/376,627 filed Aug. 18, 1999 for "Cooling Apparatus For Electronic Devices" of Guy R. Wagner et al.

* cited by examiner

Primary Examiner—Allen Flanigan

(57) ABSTRACT

A cooling system for dissipating heat from a heat source has a heat sink associated with an air moving device. The heat sink has a core member having a first surface adapted to contact at least a portion of the heat source. In addition, the core member has at least one outer peripheral surface. At least one cooling fin device having at least one inner peripheral surface and at least one cooling fin is associated with the core member wherein the inner peripheral surface of the cooling fin device is adjacent the outer peripheral surface of the core member. The air moving device is located opposite the first surface of the core member and forces air past the cooling fins in the general direction of the first surface. During operation of the cooling system, heat transfers from the heat source into the core member via the core member first surface. The core member transfers the heat to the outer peripheral surface where it is then transferred to the cooling fins. The cooling fins, in conjunction with the air of the air moving device, convect the heat to the surrounding atmosphere, thus, cooling the heat source.

2 Claims, 10 Drawing Sheets

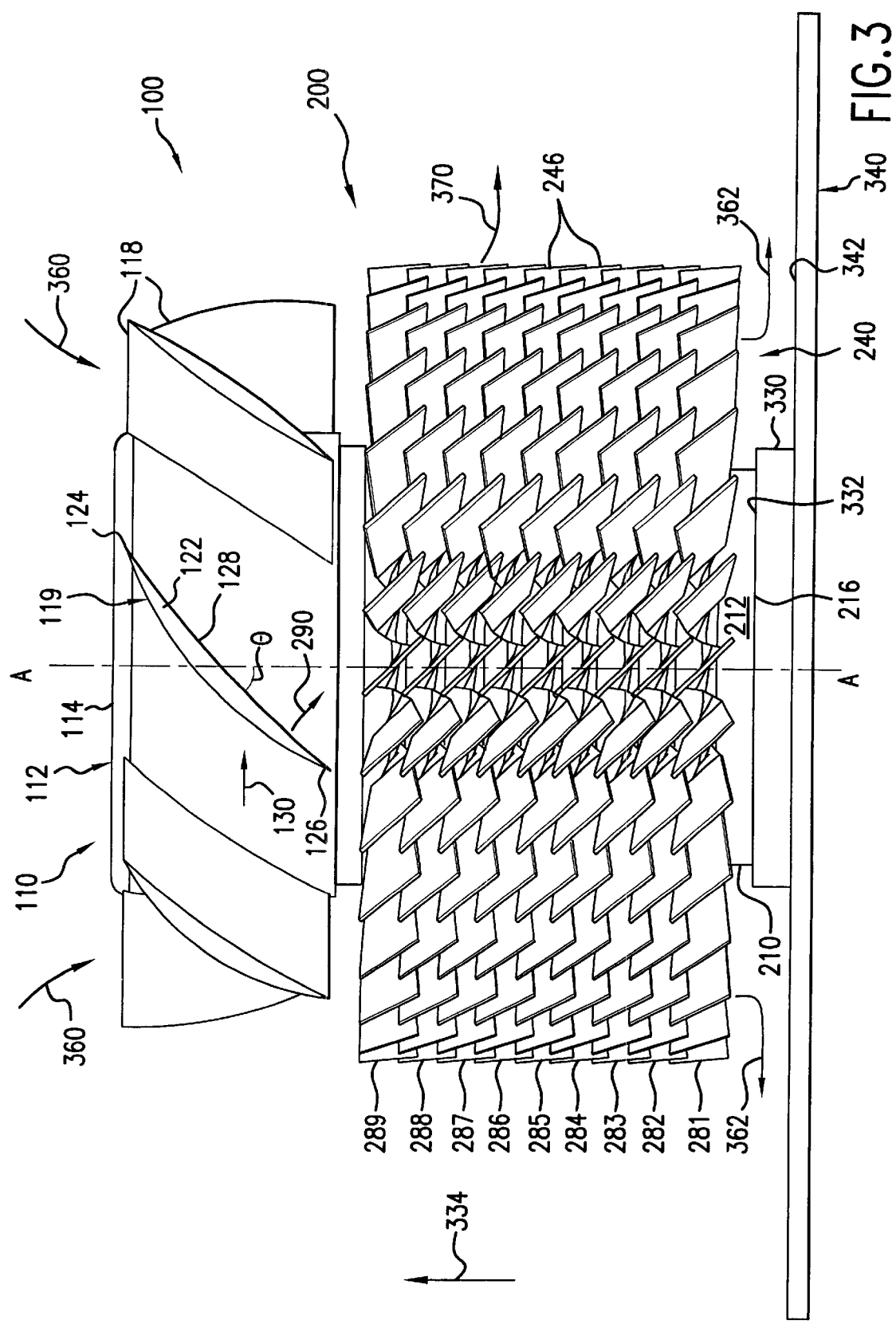

COOLING APPARATUS FOR ELECTRONIC DEVICES

FIELD OF THE INVENTION

The present invention relates generally to cooling devices and, more particularly, to a cooling device and method for removing heat from an electronic device.

BACKGROUND OF THE INVENTION

Electronic components, such as integrated circuits, are increasingly being used in different devices. One prevalent example of a device using integrated circuits is the computer. The central processing unit or units of most computers, including personal computers, is typically constructed from a plurality of integrated circuits. Integrated circuits are also used in other computer circuitry. For example, interface and memory circuits typically comprise several integrated circuits.

During normal operation, many electronic components, such as integrated circuits, generate significant amounts of heat. If this heat is not continuously removed, the electronic component may overheat, resulting in damage to the component and/or a reduction in its operating performance. For example, an electronic component may encounter thermal runaway, which may damage the electronic component. In order to avoid such problems caused by overheating, cooling devices are often used in conjunction with electronic components.

Over the years, the amount of heat generated by electronic components has increased. In addition, the size of electronic devices using these components has generally decreased, resulting in greater amounts of heat being generated within smaller confines. In order to adequately cool these hotter electronic devices without increasing their sizes, more efficient cooling devices are required.

One such cooling device used in conjunction with electronic components is a heat sink. A heat sink is a device that draws heat from a heat generating component and convects the heat to the surrounding atmosphere. The heat sink is typically formed from a thermally conductive material, such as aluminum or copper. The heat sink is usually placed on top of, and in physical contact with, the heat generating electronic component. This physical contact improves the thermal conductivity between the electronic component and the heat sink and permits heat to rise from the electronic component into the heat sink. In addition, a thermally conductive compound is typically placed between the electronic component and the heat sink to enhance to thermal conductivity between the electronic component and the heat sink. This thermal conductivity results in a substantial portion of the heat generated by the electronic component being conducted into the heat sink and away from the electronic component. The heat transfers to the surface of the heat sink where it is then convected into the surrounding atmosphere.

One method of increasing the cooling capacity of heat sinks is by including a plurality of cooling fins attached to the heat sink and a cooling fan that forces air past the cooling fins. The cooling fins serve to increase the surface area of the heat sink and, thus, increase the convection of heat from the heat sink to the surrounding atmosphere. The fan serves to force air past the fins, which further increases the convection of heat from the heat sink to the surrounding atmosphere. This increased convection, in turn, allows the heat sink to draw more heat from the electronic component. In this manner, the heat sink is able to draw a significant amount of heat away from the electronic component, which serves to cool the electronic component. Examples of such heat sinks are disclosed in U.S. Pat. No. 5,794,685 of Dean for HEAT SINK DEVICE HAVING RADIAL HEAT AND AIRFLOW PATHS and U.S. patent application Ser. No. 09/253877 of Hanzlik, et al. for COOLING APPARATUS FOR ELECTRONIC DEVICES, both of which are hereby incorporated by reference for all that is disclosed therein.

The amount of heat that may be drawn from a steady state heat source is dependent on the amount of heat that may be convected into the surrounding atmosphere. The amount of heat that may be convected into the surrounding atmosphere is, in turn, dependent on the surface area of the cooling fins and other components comprising the heat sink that convect heat to the surrounding atmosphere. For example, cooling fins with larger surface areas are generally able to convect more heat into the atmosphere.

Cooling fins with larger surface areas, however, tend to have significant barrier layers of air on the cooling fin surfaces when air is forced past the cooling fins. An air barrier is air that is adjacent the surface of a cooling fin and remains relatively stationary relative to the cooling fin as air is forced past the cooling fin. Thus, a significant barrier layer of air may result in the air being forced past cooling fins having large surface areas not being able to remove the maximum heat possible from the cooling fins. Accordingly, increasing the area of individual cooling fins may not result in a proportional cooling capability of the heat sink.

Another problem associated with larger cooling fins is that they occupy greater spaces, which could otherwise be used to reduce the size of the electronic device. Larger cooling fins also occupy space that could otherwise be used to increase the concentration of electronic components located within the electronic device. As described above, electronic components are being used in smaller devices, thus, a reduced space or a higher concentration of electronic components within the electronic devices is beneficial. The use of larger cooling fins tends to increase the size of the electronic devices or reduce the concentration of electronic components located therein.

Yet another problem associated with cooling fins is that they tend to be difficult to manufacture. For example, the cooling fins should be relatively thin in order to increase convection by providing less restrictive airflow past the fins. It should be noted that the thickness of the cooling fins must be balanced against their ability to conduct heat because thin cooling fins are generally unable to conduct from the heat sink as well as large cooling fins. The fin thins may, as an example, be made from a sheet of thermally conductive metal, such as a sheet of copper or aluminum. These cooling fins, however tend to be difficult to attach to the heat sink so as to assure low thermal resistance between the cooling fins and the heat sink. They may, as an example, be welded or brazed to the heat sink, which is relatively time consuming. Alternatively, the cooling fins may be integrally formed with the heat sink. For example, the heat sink, including the cooling fins may be molded or machined from a piece of stock. Molding or machining thin cooling fins, however, tends to be rather difficult and costly.

Thus, it would be generally desirable to provide a cooling device that overcomes these problems associated with conventional cooling devices.

SUMMARY OF THE INVENTION

An improved cooling device for dissipating heat from a heat source is disclosed herein. The cooling device may comprise an elongated core made of a thermally conductive material, such as copper or aluminum. The core may have an outer peripheral surface and an end that may be adapted to contact the heat source. At least one cooling fin device may be placed adjacent the outer peripheral surface of the core to enhance the convection of heat from the core to the surrounding atmosphere. Each cooling fin device may comprise at least one inner peripheral surface and at least one cooling fin associated therewith, wherein the inner peripheral surface of the cooling fin device is located adjacent the outer peripheral surface of the core. The area of the individual cooling fins may be small so as to reduce a barrier layer of air that builds up on the surface of the individual cooling fins when air is forced past the cooling fins. A plurality of relatively small cooling fins may be associated with the core via the cooling fin assemblies, thus, the overall surface area of the plurality of cooling fins may be relatively large, which improves convection of heat to the surrounding atmosphere.

The collars of the cooling fin devices may have inner surfaces that have substantially the same perimeter as the core. This allows the cooling fin devices to be pressed onto the core so as to form interference fits between the cooling fin devices and the core. The interference fits provide low thermal resistance between the cooling fin devices and the core, which improves the cooling capability of the cooling device by improving the thermal conductivity between the core and the cooling fin devices.

A conventional fan may be located in the vicinity of the core opposite the heat source and may serve to force air past the surfaces of the cooling fins in order to increase convection. The fan may force air in the general direction of the heat source in order to further increase the cooling capability of the cooling device. A shroud may be placed over the fan and the cooling fins to assure that air blown by the fan passes over the surfaces of the cooling fins rather than diverging from the core and the cooling fins.

The cooling fins may be relatively thin so as to minimize air resistance. Thus, a large quantity of air may be forced past the cooling fins, which in turn convects a large quantity of heat to the surrounding atmosphere. The cooling fins may, however, be thick enough so as to be able to draw a significant amount of heat from the core.

When the cooling device is used to dissipate heat generated by a heat generating electronic component mounted to a circuit board, the core is placed adjacent the electronic component. Heat is drawn from the electronic component into the core and away from the electronic component. The heat then transfers to the surface of the core and to the cooling fins. The air forced past the cooling fins by the fan convects the heat to the surrounding atmosphere, thus, cooling the electronic component. The elongated shape of the core allows for heat to be drawn primarily normal to the printed circuit board. Thus, the cooling device may occupy minimal area, which allows a higher concentration of electronic components to be mounted to the printed circuit board.

BRIEF DESCRIPTION OF THE DRAWING

FIG. 3 is a side view of the cooling device of FIG. located adjacent a heat generating electronic device.

DETAILED DESCRIPTION OF THE INVENTION

Figure 1:
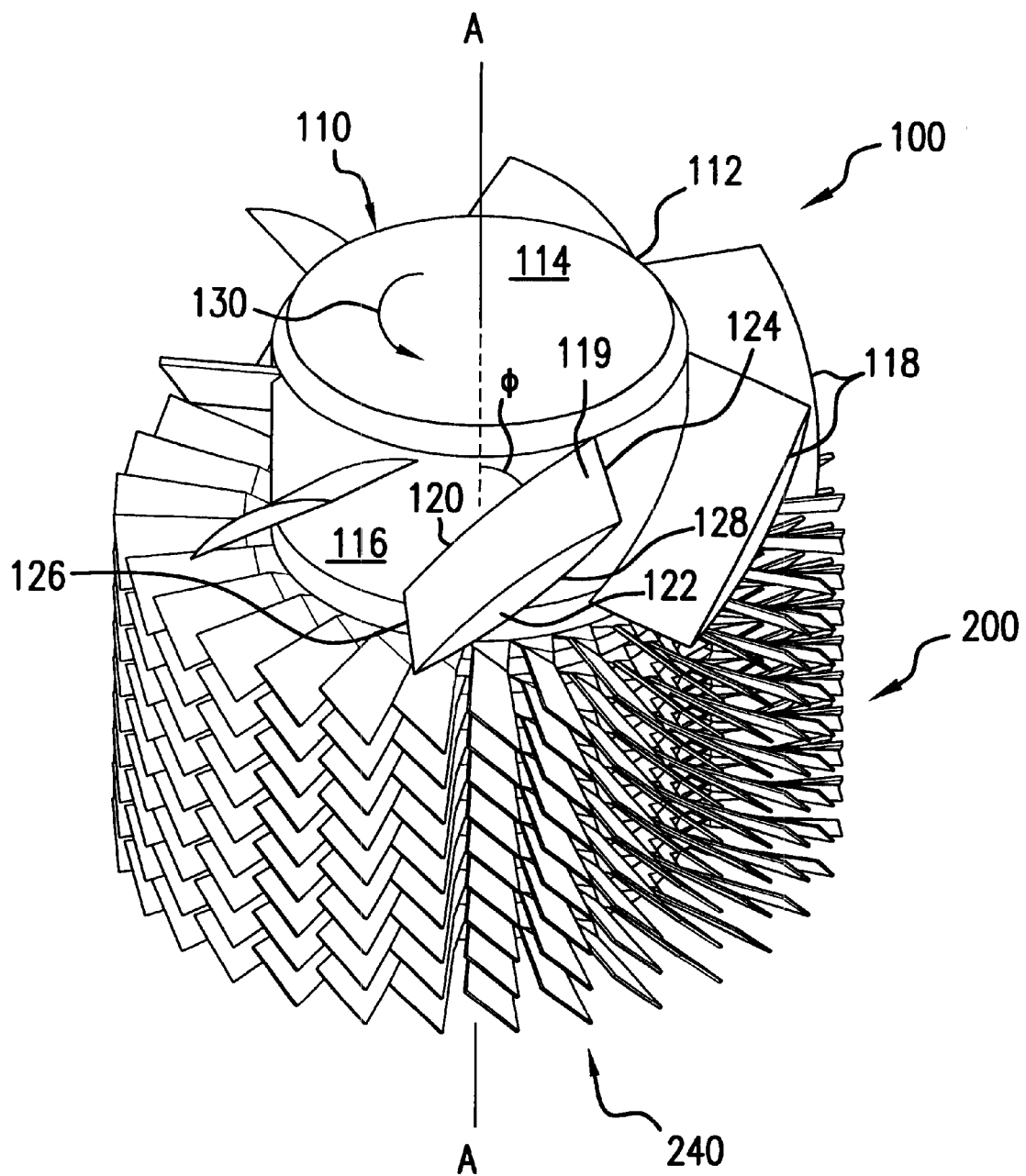
FIG. 1 is a top perspective view of a cooling device having a plurality of fin rings and a fan.

FIGS. 1 through 11, in general, illustrate a heat sink 200 for removing heat from a heat source 330. The heat sink 200 may comprise: at least one first surface 216 adapted to contact at least a portion 332 of the heat source 330; a core member 210, wherein the at least one first surface 216 is located on the core member 210; at least one outer peripheral surface 212 located on the core member 210; and at least one cooling fin device 240 having at least one inner peripheral surface 248 and at least one cooling fin 246 associated therewith. The at least one inner peripheral surface 248 of the cooling fin device 240 may be adjacent the at least one outer peripheral surface 212 of the core member 210.

FIGS. 1 through 11 also, in general, illustrate a method of manufacturing a heat sink 200. The method may comprise: providing a core member 210 having at least one outer peripheral surface 212; providing at least one cooling fin device 240 having at least one inner peripheral surface 248 and at least one cooling fin 246 associated therewith; and locating the at least one inner peripheral surface 248 of the at least one cooling fin device 240 adjacent the at least one outer peripheral surface 212 of the core member 210.

FIGS. 1 through 11 also, in general, illustrate a heat sink 200 for removing heat from a heat source 330. The heat sink 200 may comprise: at least one first surface 216 adapted to contact at least a portion 332 of the heat source 330; a core member 210, wherein the at least one first surface 216 is located on the core member 210; an axis AA associated with the core member 210, wherein the axis AA is substantially normal to the at least one first surface 216; at least one outer peripheral surface 212 located on the core member 210; at least one cooling fin located adjacent the at least one outer peripheral surface 212 of the core member 210 and extending substantially radial and substantially axial relative to the axis AA; and a shroud that substantially encompasses the at least one cooling fin and the core member 210.

Having generally described the cooling device 100, FIG. 1, it will now be described in greater detail. The cooling device 100 may have a fan 110 associated with a heat sink 200. The following description describes the heat sink 200 followed by a description of the fan 110. A description of the operation of the fan 110 associated with the heat sink 200 follows their individual descriptions.

Figure 2:
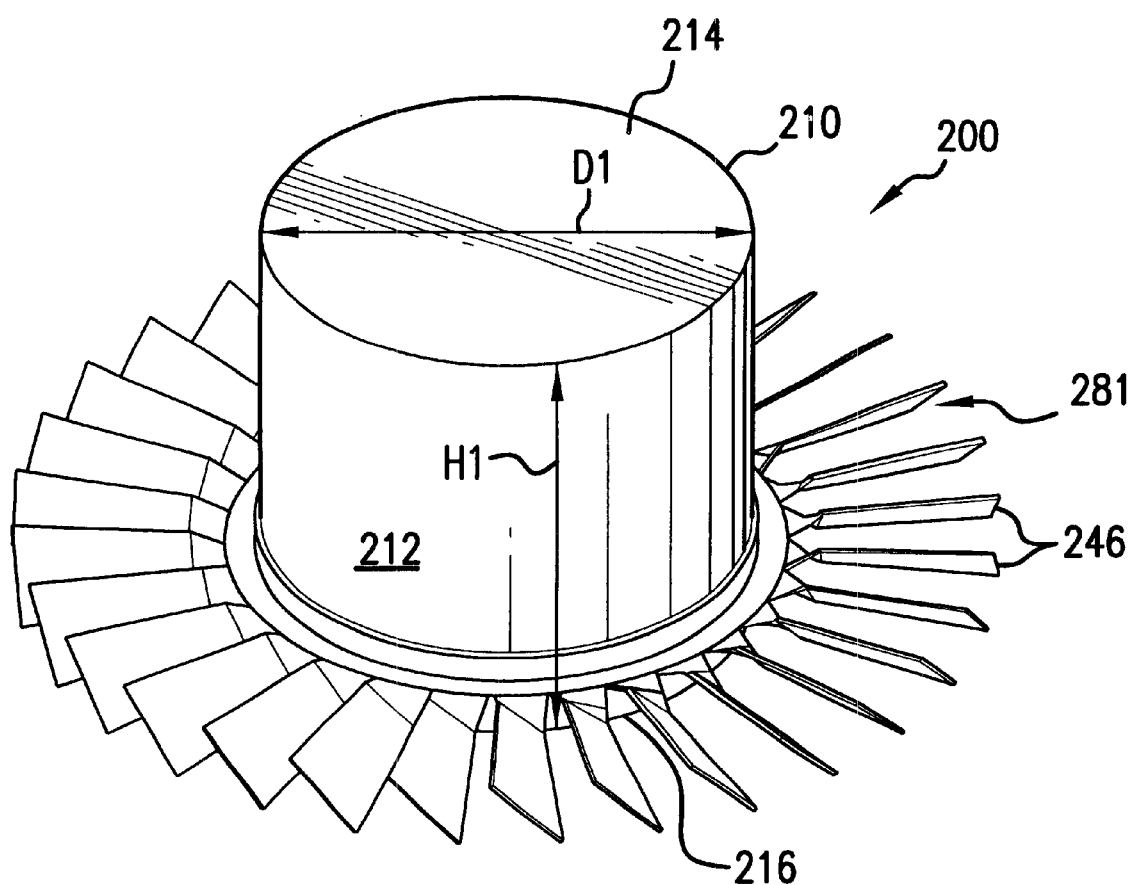
FIG. 2 is a top perspective view of the cooling device of FIG. 1 having a single first fin ring and without the fan.

Referring to FIG. 2, which shows a partially constructed heat sink 200, the heat sink 200 may have a core 210 with a first fin ring 281 located adjacent the core 210. For illustration purposes, FIG. 2 shows only a single first fin ring 281 attached to the core 210. Further below in this description, the heat sink 200 will be described having a plurality of fin rings 240, FIG. 1, attached to the core 210. The first fin ring 281 and other fin rings described herein are sometimes referred to as cooling fin devices.

The core 210 may be made of a thermally conductive material, such as copper or aluminum. The core 210 may have a top portion 214 and a lower portion 216 with a peripheral surface 212 located therebetween. The core 210 may have a substantially cylindrical shape with a diameter D1. A height H1 may extend between the top portion 214 and the lower portion 216. The diameter D1 may, as an example, be approximately 3.0 centimeters and the height H1 may also, as an example be approximately 3.0 centimeters. The diameter D1 and height H1, however, are dependent on the specific cooling application of the cooling device 100. The peripheral surface 212 may have a perimeter, which in the case of the peripheral surface 212 illustrated herein, is the cylindrical peripheral surface 212 having a diameter D1. The core 210 is illustrated herein as being cylindrical for illustration purposes, however, the core 210 may have other shapes. For example, the core 210 may be in the shape of a cube, wherein the perimeter of a cube-shaped core is the boundary defined by the sides of the cube.

Referring briefly to FIG. 3, which is a side view of the cooling device 100 of FIG. 1, the lower portion 216 of the core 210 may be adapted to contact a top surface 332 of a heat generating device 330. More specifically, the lower portion 216 may be adapted to provide the maximum thermal conductivity between the core 210 and the heat generating device 330. For example, in the situation where the heat generating device 330 is an integrated circuit, the top surface 332 of the integrated circuit is typically planar. Accordingly, the lower portion 216 of the core 210 may be substantially planer and may have an area that is approximately the same as the area of the top surface 332 of the heat generating device 330.

Figure 4A:
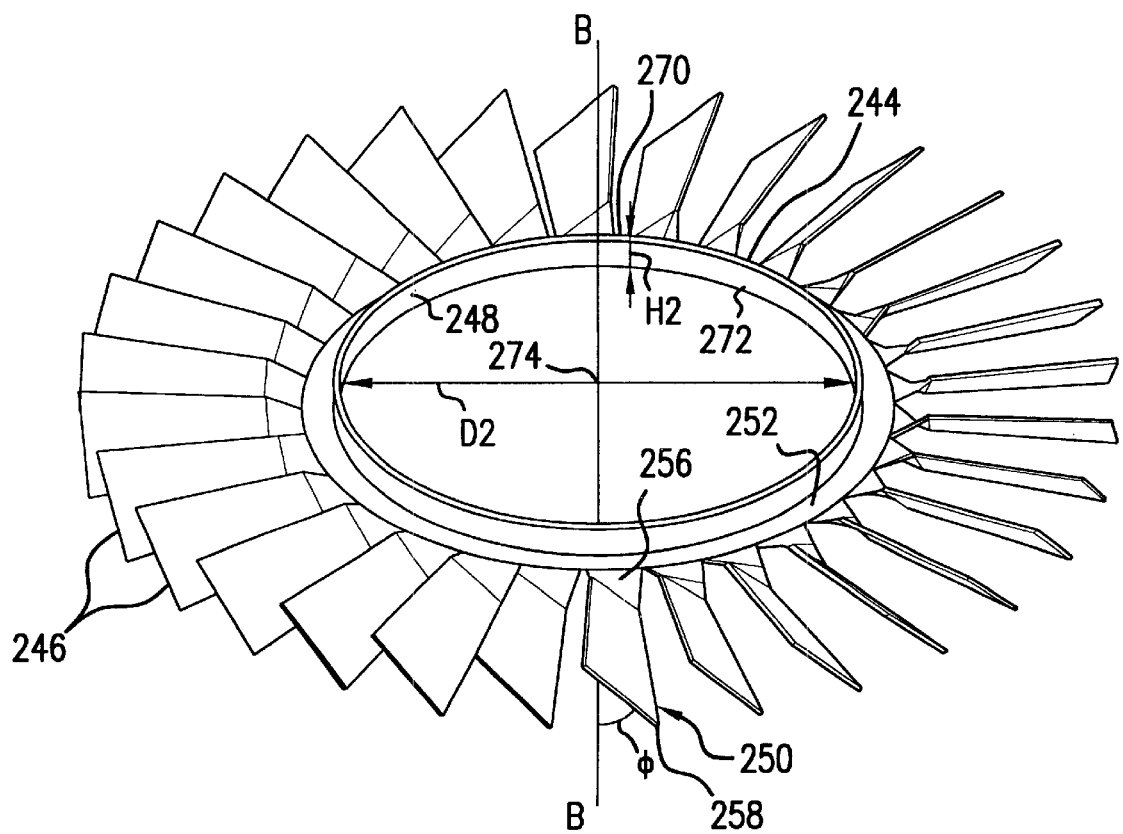
FIG. 4 is a top perspective view of a fin ring of the type illustrated in the cooling device of FIG. 2.
Figure 4B:
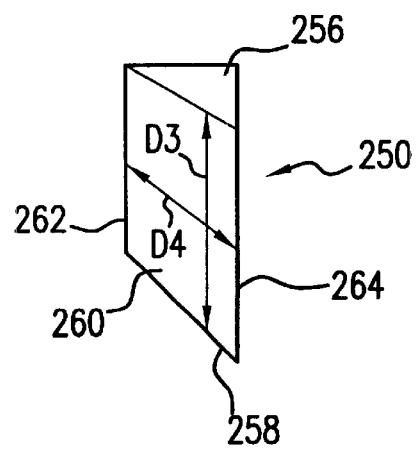

Having described the core 210, the first fin ring 281 will now be described. FIG. 4 is a top perspective view of the first fin ring 281 separated from the core 210, FIG. 2, and is representative of the remaining fin rings 240 that may be located adjacent the core 210 as illustrated in FIG. 3. The first fin ring 281 may have a collar 244 with a plurality of cooling fins 246 attached thereto. The collar 244 may have an inner peripheral surface 248 having an upper ring portion 270 and a lower ring portion 272. The upper portion 270 and the lower portion 272 may be separated by a height H2, which may, as an example, be approximately 0.25 centimeters. The upper ring portion 270 and the lower ring portion 272 may be located on substantially parallel planes. A reference axis BB may pass through the mid point 274 of the collar 244 and may be substantially normal to the planes defined by the upper ring portion 270 and the lower ring portion 272.

The inner peripheral surface 248 has a perimeter associated with it, which in the embodiment described herein is a cylindrical surface extending between the upper portion 270 and the lower portion 272. The perimeter of the inner peripheral surface 248 may be substantially similar to the perimeter a cylindrical portion of the surface 212, FIG. 2, of the core 210. For example, the inner peripheral surface 248 may be round and may have a diameter D2 that is approximately the same as the diameter D1 of the core 210, FIG. 2. In one embodiment of the heat sink 200, FIG. 2, the diameter D1 of the core 210 and the diameter D2, FIG. 4, of the first fin ring 281 are appropriately sized so as to cause an interference fit between the first fin ring 281 and the core 210 as is described in greater detail below.

The collar 244 may have an outer surface 252 wherein the cooling fins 246 are attached to the outer surface 252. Reference is made to a first fin 250, which is representative of all the cooling fins 246 and their association with the outer surface 252. The first fin 250 may have a mounting portion 256, an end portion 258, a surface 260, an upper end 262, and a lower end 264. The surface 260 may be defined by the boundaries of the mounting portion 256, the end portion 258, the upper end 262, and the lower end 264. The surface 260 may be substantially planar, accordingly, the end portion 258 may be substantially linear. A length D3 may extend between the mounting portion 256 and the end portion 258. The length D3 may, as an example, be approximately 11 to 13 millimeters. A length D4 may extend between the upper end 262 and the lower end 264. It is preferable to maintain the length D4 relatively small in order to reduce the boundary layer of air that may accumulate on the surface 260 of the first fin 250 when air is forced past the surface 260. The D4 may, as an example, be approximately 3.25 millimeters. The mounting portion 256 may be a twisted portion of the first fin 250 and may serve to create an angle φ between the end portion 258 and the reference axis BB. The angle φ may, as an example, be approximately 45 degrees.

The collar 244 and the cooling fins 246 may be made of a heat conducting material such as aluminum or copper. The junction between the collar 244 and the mounting portion 256 of the cooling fins 246 may conduct heat with minimal thermal resistance. For example, the collar 244 may be integrally formed with the cooling fins 246 or they may be welded together. In a non-limiting example of manufacturing the first fin ring 281, the first fin ring 281 may be fabricated from a single metal sheet, such as a copper or aluminum sheet. The metal sheet may, as an example, have a thickness of approximately 15 to 20 thousandths of an inch. Fabrication of the first fin ring 281 may commence with stamping the collar 244 out of the metal sheet. The collar 244 is essentially a circular cutout having a diameter D2 and a height H2. Accordingly, the stamping process forms the diameter D2 and the height H2 of the collar 244. The cooling fins 246 may then be stamped out of the metal sheet. For example, the cooling fins 246 may be cut out of the metal sheet via a conventional stamping process. The metal sheet may then be placed into a dye that twists the cooling fins 246 at the mounting portion 256 in order to form the angle φ.

Figure 5:
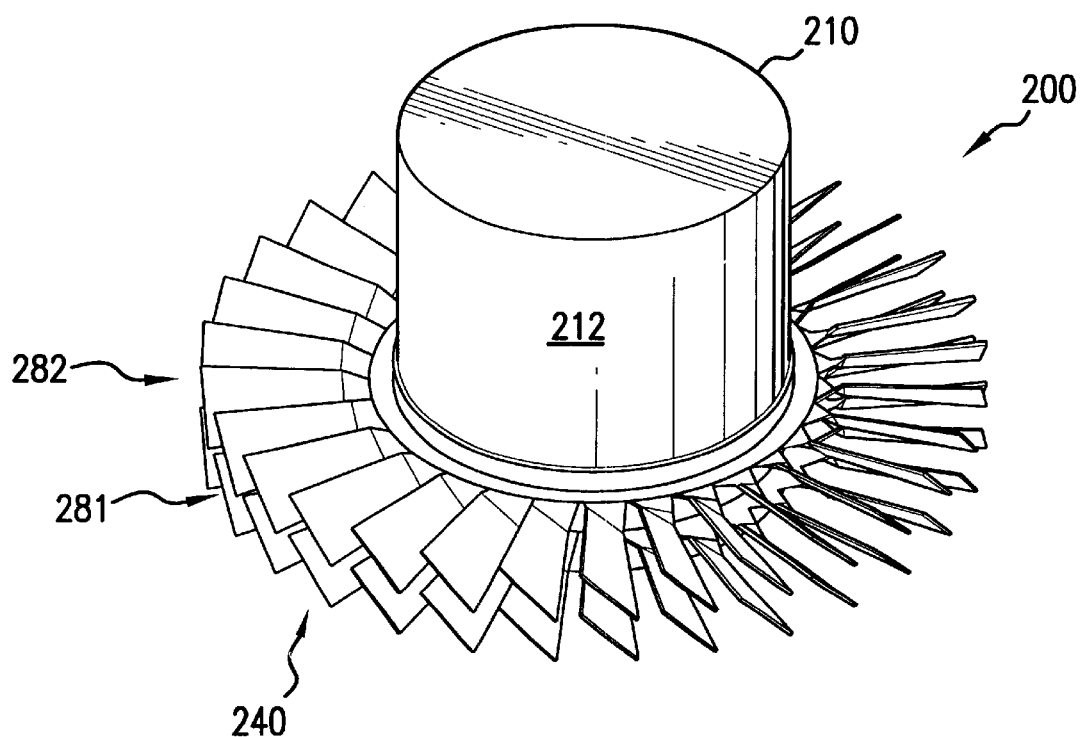
FIG. 5 is a top perspective view of the cooling device of FIG. 2 having a second fin ring located adjacent the first fin ring.

Referring again to FIG. 2, the first fin ring 281 may be pressed onto the core 210 in a conventional manner to form an interference fit between the first fin ring 281 and the core 210. The interference fit is a result of a cylindrical portion of the surface 212 of the core 210 being substantially the same as the perimeter of the inner peripheral surface 248, FIG. 4, of the first fin ring 281. Accordingly, the diameter D1 of the core 210 is substantially the same or slightly larger than the diameter D2, FIG. 4, of the first fin ring 281. As shown in FIG. 2, the first fin ring 281 may be located in the vicinity of the lower portion 216 of the core 210. Referring to FIG. 5, which is the heat sink 200 of FIG. 2 with an additional fin ring attached thereto, after the first fin ring 281 has been pressed onto the core 210 a second fin ring 282 may be pressed onto the core 210. The process of pressing fin rings 240 onto the core 210 may continue until the surface 212 of the core 210 is substantially covered with fin rings 240 as illustrated in FIG. 3.

FIG. 3 illustrates nine fin rings 240 affixed to the core 210. The fin rings 240 are referred to individually as the first through the ninth fin rings and referenced numerically as 281 through 289 respectively. The plurality of fin rings 240 substantially increases the surface area available on the heat sink 200 for convecting heat to the surrounding atmosphere. In addition, the fin rings 240 are relatively thin, which increases their ability to convect heat to the surrounding atmosphere by minimizing the air resistance through the fin rings 240 as is described below. As illustrated in FIG. 3, the cooling fins 246 are substantially planar and are located on planes that are substantially parallel to each other. As described in greater detail below, the planar arrangement of the cooling fins 246 forms channels that serve to guide air past the cooling fins 246, which increases convection of heat to the surrounding atmosphere. The planar arrangement of the fin rings 240 is described below with reference to the schematic illustration of FIG. 6.

Having described the heat sink 200, the fan 110 will now be described followed by a description of the association between the heat sink 200 and the fan 110.

Referring again to FIG. 3, the fan 110 may be a conventional electric fan. The fan 110 may, as an example, be of the type commercially available from the Matsushita Electric Corporation as Model FBA06T12H and sold under the tradename PANAFLO. The fan 110 may have a rotating portion 112, wherein the rotating portion 112 may have a top portion 114, a lower portion, not shown in FIG. 3, and a peripheral side wall 116. A reference axis AA may extend through the center of the top portion 114 and may be substantially normal to the top portion 114. As described in greater detail below, the reference axis AA may define a center of rotation of the rotating portion 112. A direction 130 is used herein to describe the rotational direction of the rotating portion 112 about the reference axis AA.

The peripheral side wall 116 of the fan 110 may have a plurality of circulating fins 118 attached thereto. The circulating fins 118 may be substantially identical to each other. A first circulating fin 119 is used as a reference to describe all the circulating fins 118. The first circulating fin 119 may have an inner side 120, FIG. 1, an outer side 122, an upper side 124, and a lower side 126. The sides may define the boundaries of a surface 128. The inner side 120, FIG. 1, of the first circulating fin 119 may be attached to the peripheral side wall 116 of the rotating portion 112 in a conventional manner. For example, the first circulating fin 119 may be adhered to or integrally formed with the side wall 116. The attachment of the first circulating fin 119 to the side wall 116 may define an angles θ between the surface 128 and the reference axis AA. The angle θ may, as an example, be about 45 degrees. In a preferred embodiment, the angle θ is equal to 90 degrees minus the angle φ of FIG. 4. As described in greater detail below, the angle θ may serve to determine the direction of air flow generated by the fan 110 as the rotating portion 112 rotates in the direction 130.

Having described the fan 110 and the heat sink 200 separately, their association with each other will now be described.

As illustrated in FIG. 3, the fan 110 may be located adjacent the top portion 214, FIG. 2, of the core 210. The fan 110 may, as examples, be attached to the core 210 by the use of fasteners, e.g., screws, or it may be adhered to the core 210. It should be noted, however, that the fan 110 does not need to be physically attached to the core 210 and that the fan 110 only needs to be able to force air past the cooling fins 246.

Figure 6:
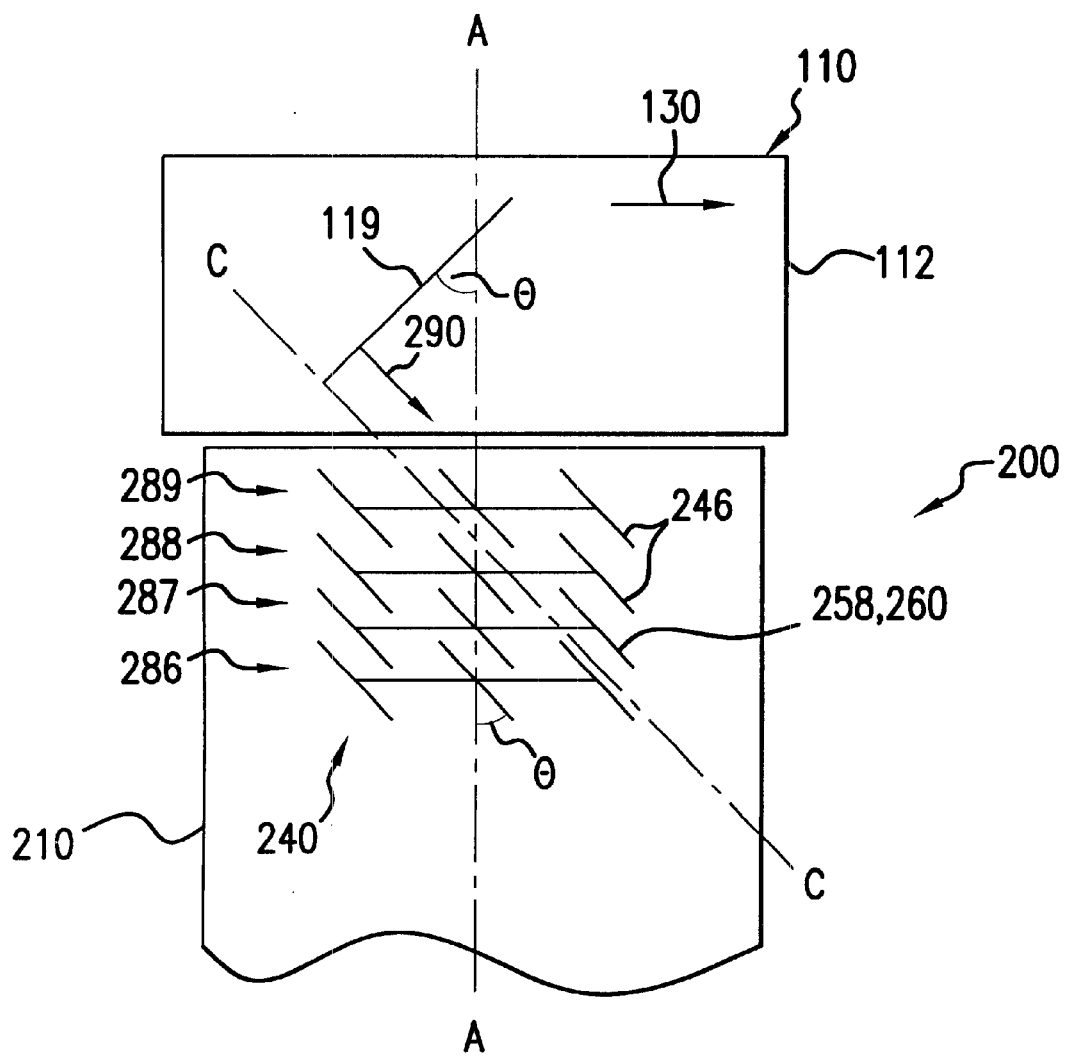
FIG. 6 is a schematic illustration of the cooling device illustrated in FIG. 1.

FIG. 6, which is a side schematic illustration of the fan 110 associated with the heat sink 200, illustrates the air flow between the fan 110 and the heat sink 200. It should be noted that for illustration purposes the heat sink 200 illustrated in FIG. 6 only shows a limited number of fin rings 240 and cooling fins 246. As described above, the first circulating fin 119 is positioned at an angle θ relative to the reference axis AA. The angle θ is described herein as being approximately 45 degrees. The cooling fins 246 are positioned at an angle φ relative to the reference axis AA, which is described herein as being approximately 45 degrees. A reference axis CC may extend parallel to the end portions 258 of the cooling fins 246 and may be substantially perpendicular to the surface 128 of the first circulating fin 119. Accordingly, the reference axis CC may be positioned at the angle θ relative to the reference axis AA. An air flow direction 290 commences at the surface 128 of the first circulating fin 119 and extends parallel to the reference axis CC, which is normal to the surface 128. As described below, the air flow direction 290 is the direction that air flows as the first circulating fin 119 rotates in the direction 130.

When the rotating portion 112 rotates in the direction 130, the first circulating fin 119 forces air to circulate past the cooling fins 246. The airflow generated by the rotating first circulating fin 119 flows in the air flow direction 290, which is parallel to the reference axis CC. The air flow direction 290 is, accordingly, parallel to the end portions 258 and the surfaces 260 of the cooling fins 246. This relation between the air flow direction 290 and the cooling fins 246 allows air generated by the rotating first circulating fin 119 to pass over the surfaces 260 of the cooling fins 246 with little resistance. In addition, this air flow direction 290 relative to the cooling fins 246 reduces any eddy currents that may, in turn, reduce the air flow through the heat sink 200. In addition, as described above, the cooling fins 246 are thin enough to minimize air resistance, but thick enough to transfer heat from the core 210. Thus, the cooling fins 246 cause little resistance to the air flow through the heat sink 200, which in turn, allows for the maximum convection of heat from the cooling fins 246 to the surrounding atmosphere.

The thin cooling fins 246 and their placement relative to each other allows them to be condensed or "nested" which in turn allows a greater number of cooling fins 246 to convect heat to the surrounding atmosphere.

In addition, the placement of the fin rings 240 and the cooling fins 246 creates channels for air to flows past the cooling fins 246. One such channel is defined by the reference axis CC, which is parallel to the air flow direction 290. Other channels are parallel to the channel defined by the reference axis CC. Accordingly, the channels allow air to be able to be forced past the cooling fins 246 with minimal resistance and with minimal creation of eddy currents.

Referring again to FIG. 3, having described the cooling device 100, it will now be described cooling a heat generating device 330 that is mounted to a top surface 342 of a printed circuit board 340. The heat generating device 330 is described herein as being an integrated circuit that generates heat when it is in use. The heat generating device 330 may have a top surface 332 wherein most of the heat generated by the heat generating device 330 flows from the top surface 332 in a direction 334. The cooling device 100 may be operatively associated with the heat generating device 330 so that the lower portion 216 of the core 210 is in thermal contact with the top surface 332 of the heat generating device 330. In order to assure thermal conductivity between the heat generating device 330 and the cooling device 100, the cooling device 100 may be attached to the printed circuit board 340 in a conventional manner.

When the heat generating device 330 is in use, it generates more heat than it can dissipate alone. Heat accumulates in the top surface 332 of the heat generating device 330 and generally flows in the direction 334. The heat generated by the heat generating device 330 is absorbed into the core 210 by virtue of the thermal contact between the top surface 332 of the heat generating device 330 and the lower portion 216 of the core 210. Thus, the temperature of the heat generating device 330 is reduced by the absorption of heat into the core 210. The heat absorbed by the core 210 dissipates to the surface 212 where some of the heat is convected directly to the surrounding atmosphere. The interference fits between the fin rings 240 and the core 210 cause the majority of the heat dissipated to the surface 212 of the core 210 to transfer to the fin rings 240 and into the cooling fins 246.

Simultaneous to heat being absorbed into the core 210 and dissipated to the cooling fins 246, the fan 110 forces air to flow in the air flow direction 290 past the surfaces 260 of the cooling fins 246. More specifically, the fan 110 may draw air into the cooling device 100 along an air flow direction 360. The air passes through the heat sink 200 in the air flow direction 290 and is exhausted along an air flow direction 362. Accordingly, the heat in the cooling fins 246 is convected into the surrounding atmosphere.

The rate of heat transfer between the core 210 and the cooling fins 246 is directly proportional to the temperature difference between the cooling fins 246 and the surface 212 of the core 210. Likewise, the heat transfer from the heat generating device 330 to the core 210 is directly proportional to the temperature of the core 210. Accordingly, a higher rate of heat transfer from the heat generating device 330 can be accomplished by significantly cooling the cooling fins 246. The temperature of the cooling fins 246 is proportional to their position relative to the heat generating device 330, wherein the cooling fins 246 positioned close to the heat generating device 330 are hotter than those positioned further from the heat generating device 330. By forcing relatively cool air in the air flow direction 290, all the cooling fins 246 are exposed to relatively cool air, which reduces their temperature. The relatively cool cooling fins 246 are able to transfer heat from the surface 212 of the core 210 at an increased rate, which in turn, cools the core 210 at an increased rate. The cooler core 210 is, thus, able to remove more heat at a higher rate from the heat generating device 330. If, on the other hand, the air flow direction 290 is opposite that illustrated herein, the cooling fins 246 located on the fin rings 240 above the first fin ring 281 would be cooled by air that had convected heat from the first fin ring 281, which is the hottest of the fin rings 240. The remaining fin rings 240 would, thus, be heated by the heat convected from the first fin ring 281. This heating reduces the cooling capability of the heat sink 200, however, some applications of the cooling device 100 may require the air flow in this direction.

Due to inherent air restrictions in the heat sink 200 caused by the cooling fins 246, not all the air forced into the heat sink 200 by the fan 110 passes by the cooling fins 246. For example, the fan 110 may cause air pressure to build up in the cooling fins 246, which in turn, causes some air to leave the heat sink 200 without passing by all the fin rings 240. The heat sink 200 of FIG. 3 shows that some air may follow an air flow direction 370 and may be exhausted from the heat sink 200 without passing by all of the cooling fins 246. Accordingly, the air following the air flow direction 370 is not used efficiently.

Figure 7:
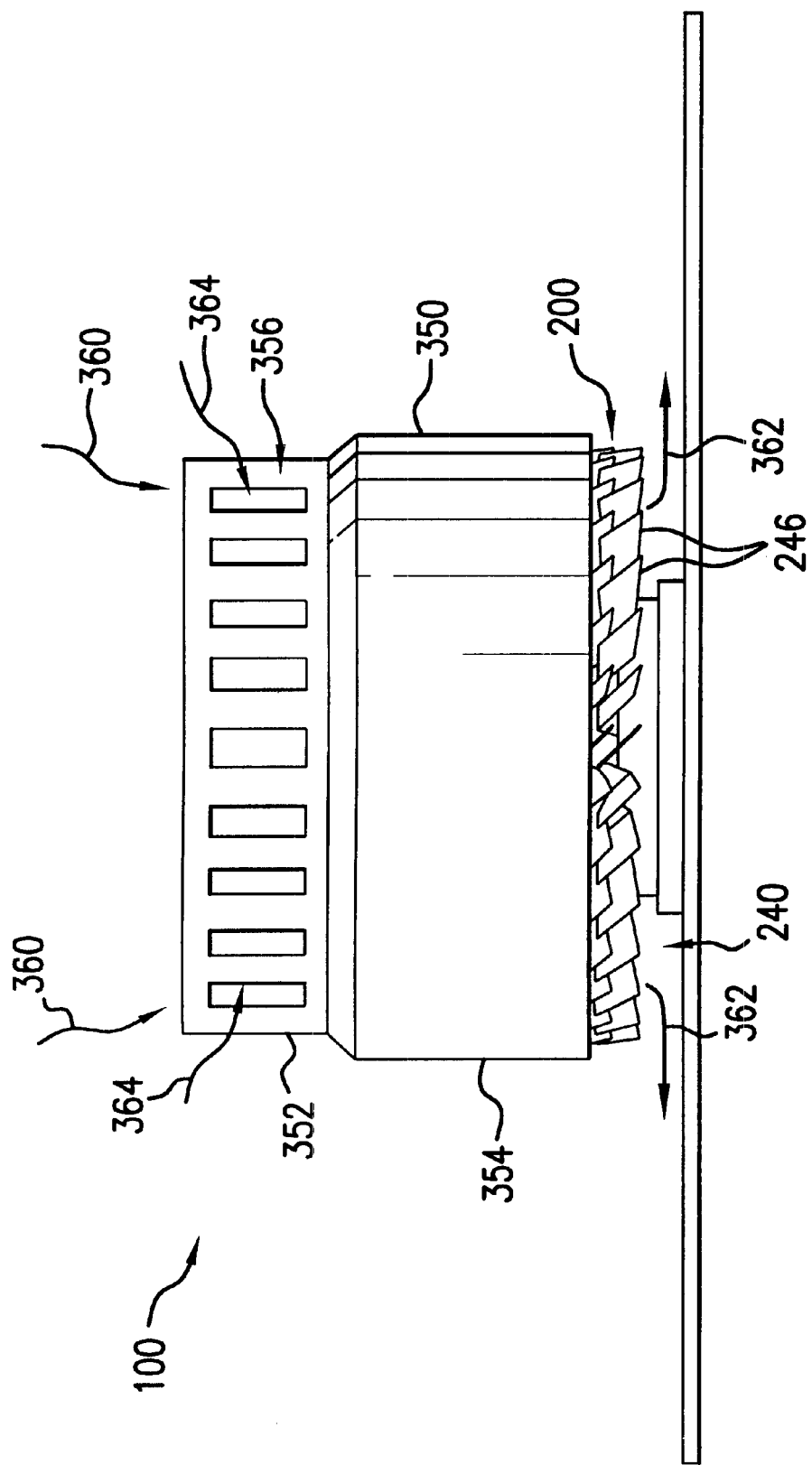
FIG. 7 is a side view of the cooling device of FIG. 3 with a shroud attached thereto.

Referring to FIG. 7, in order to assure all the air drawn into the cooling device 100 passes the cooling fins 246, a shroud 350 may be added to the cooling device 100. The shroud 350 may, as an example, be a duct that fits over the heat sink 200 and does not allow air to escape from the heat sink 200 until it has passed by all the cooling fins 246. Thus, all the air entering the cooling device 100 along the air flow direction 360 is exhausted from the cooling device 100 along the air flow direction 362. Accordingly, the efficiency of the cooling device 100 is significantly improved.

The shroud 350 may have an upper portion 352 and a lower portion 354. The upper portion 352 may substantially encompass the fan, not shown, and the lower portion 354 may substantially encompass the heat sink 200. A plurality of openings 356 may be formed into the upper portion 352 in order to facilitate air flow through the cooling device 100. More specifically, air may flow in an air flow direction 364 through the openings 356 where it joins the air flowing along the air flow direction 360. Accordingly, the openings 356 may serve to increase the volume of air that passes the cooling fins 246, which in turn increases the convection of heat to the surrounding atmosphere. The shroud 350 is illustrated as having slots 364 that are vertical, however, the slots 364 may be slanted to correlate with the angle of the first circulating fin 119, FIG. 3. The slots 364 may also be slanted so as to correlate with the air flow generated by the fan 110, FIG. 1.

Having described an embodiment of the cooling device is 100, other embodiments of the cooling device 100 will now be described.

Referring again to FIG. 5, the cooling device 100 has been described here as having the fin rings 240 pressed onto the core 210. Pressing the fin rings 240 onto the core 210 creates interference fits between the fin rings 240 and the core 210, which provide for high thermal conductivity between the core 210 and the fin rings 240. The interference fits, however, require that the core 210 and the fin rings 240 be manufactured to precise specifications. If precise manufacturing specifications are not achieved, the fin rings 240 may be loose on the core 210 or the fin rings 240 may not be able to be pressed onto the core 210.

Figure 8:
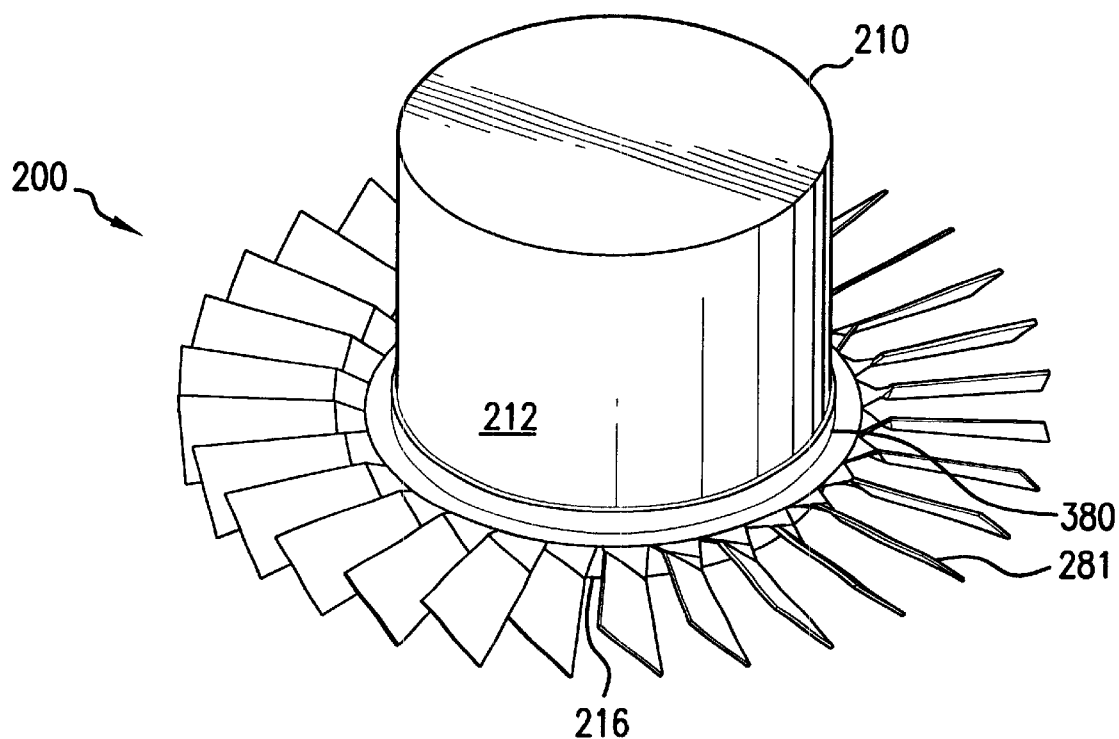
FIG. 8 is a top perspective view of the cooling device of FIG. 2 with the addition of a compression ring.

Referring to FIG. 8, the above-described problems of controlling the specifications of the fin rings 240, FIG. 3, may be overcome by the addition of compression rings pressed onto the core 210. In this embodiment of the heat sink 200, interference fits between the fin rings 240 and the core 210 are not required. A compression ring 380 may abut the top side of the first fin ring 281. A second compression ring, not shown, may abut the bottom side of the first fin ring 281. The compression ring 380 may be a ring of thermally conductive material, such as copper or aluminum, that is pressed onto the core 210 and firmly abuts the first fin ring 281. Heat in the core 210 may then be transferred to the first fin ring 281 via the compression ring 380. Accordingly, the use of the compression ring 380 permits the first fin ring 281 to be manufactured to looser specifications than those described above.

A plurality of compression rings, not shown in FIG. 8 may be pressed onto the core 210 during the manufacturing process of the heat sink 200. For example, one compression ring, not shown in FIG. 8, may be pressed onto the core 210 in the vicinity of the lower portion 216. The first fin ring 281 may then be placed over the core 210 so as to abut the compression ring located in the vicinity of the lower portion 216. The compression ring 380 may then be pressed onto the core 210 so as to abut the first fin ring 281. Accordingly, the first fin ring 281 is sandwiched between compression rings. The compression rings may then be forced together to so that the first fin ring 281 is tightly compressed between them. This compression serves to enhance the thermal conductivity between the compression rings and the first fin ring 281, which in turn enhances the cooling capability of the heat sink 200.

Figure 9:
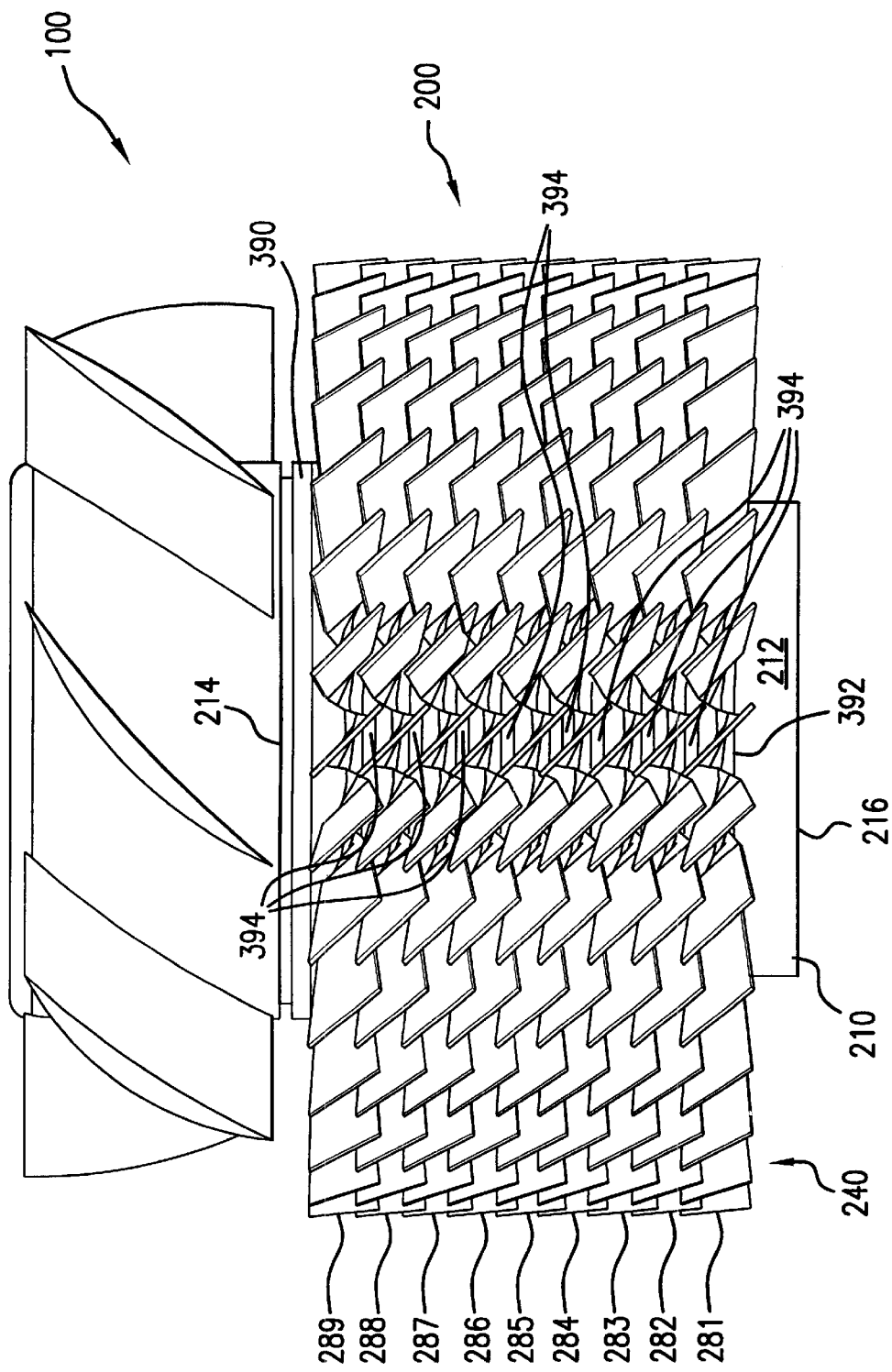
FIG. 9 is a side view of the cooling device of FIG. 1 with a plurality of compression rings attached thereto.

Referring to FIG. 9, a plurality of compression rings may be pressed onto the core 210. The heat sink 200 illustrated in FIG. 9 is similar to the heat sink 200 illustrated in FIG. 3, however, the heat sink 200 of FIG. 9 has a plurality of compression rings pressed onto the core 210. The heat sink 200 may have a top compression ring 390 located in the vicinity of the top portion 214 of the core 210. The heat sink 200 may also have a bottom compression ring 392 located in the vicinity of the lower portion 216 of the core 210. A plurality of inner compression rings 394 may be pressed onto the core 210, wherein one inner compression ring 394 is located between each of the fin rings 240.

The heat sink 200 of FIG. 9 may be manufactured by first pressing the top compression ring 390 onto the core 210. The ninth fin ring 289 may then be slipped over the core 210 and placed near the top compression ring 390. An inner compression ring 394 may then be pressed onto the core so as to sandwich the ninth fin ring 289 between compression rings. The eighth fin ring 288 may then be slipped over the core 210 to abut the previously pressed on inner compression ring 394. The process of alternating fin rings 240 and inner compression rings 394 continues until all of the fin rings 240 have been placed onto the core 210. Accordingly, an inner compression ring 394 is located between each fin ring 240. The bottom compression ring 392 may then be pressed onto the core 210. In order to assure that thermal contact exists between the fin rings 240 and the compression rings 390, 392, 394, the top compression ring 390 and the bottom compression ring 392 may be pressed together. This will cause the fin rings 240 to contact all the compression rings 390, 392, 394, which increases the thermal conductivity between the surface 212 of the core 210 and the fin rings 240.

Referring again to FIG. 3, in one embodiment of the cooling device 100, the core 210 may be a heat pipe or have a heat pipe located therein. A heat pipe is a device that is known in the art and serve to rapidly transfer heat. Thus, the interior of the core 210 may be a partially evacuated chamber containing a small amount of a liquid. When the core 210 is cool, the liquid is located in the vicinity of the lower portion 216 of the core 210. The liquid evaporates when it is heated by the heat generating device 330. The vapor from the evaporated liquid condenses on the sides of the core 210 and, thus, transfers its heat to the sides of the core 210. The heat may then quickly transfer to the surface 212 of the core 210. The heat may then be convected to the surrounding atmosphere as described above. The use of the heat pipe substantially increases the heat transfer through the core 210, which in turn increases the cooling capability of the cooling device 100. Examples of heat pipes are disclosed in the following United States patents and patent applications, which are all hereby incorporated by reference for all that is disclosed therein: Ser. No. 09/376,627 of Wagner et al. for COOLING APPARATUS FOR ELECTRONIC DEVICES; registration number U.S. Pat. No. 5,694,295 of Masataka et al. for HEAT PIPE AND PROCESS FOR MANUFACTURING THE SAME.

Figure 10:
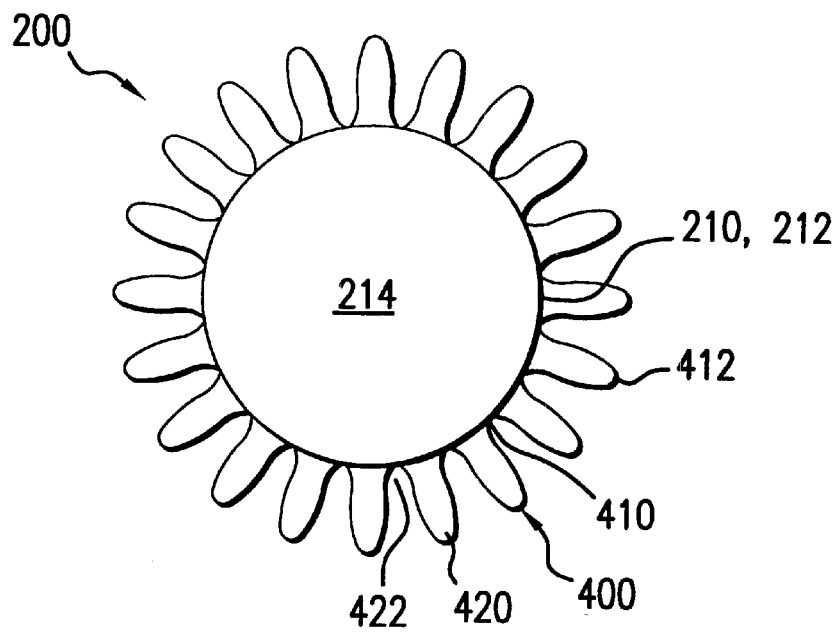
FIG. 10 is a top cutaway view of a cooling device having a ribbon-type cooling fin associated therewith.
Figure 11:
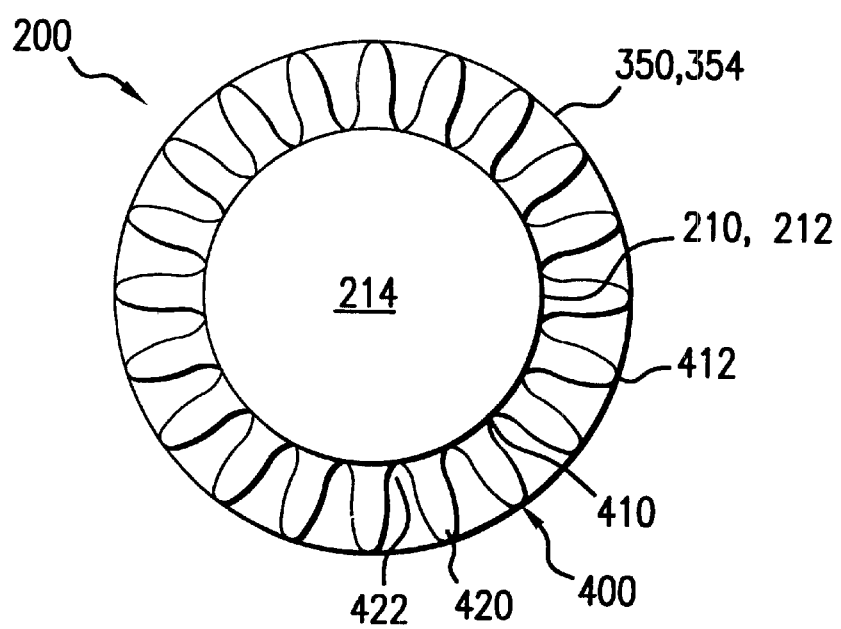
FIG. 11 is the cooling device of FIG. 10 with the addition of a shroud encompassing the core and ribbon-type cooling fin.

The heat sink 200 has been described herein as having a plurality of cooling fins 246 that extend radially from the core 210. Another embodiment of the heat sink 200 is illustrated in FIG. 10 and uses a ribbon-type cooling fin, which is sometimes referred to herein as a cooling ribbon 400. The cooling ribbon 400 may, as an example, be constructed from a single piece of a thermally conductive material, such as a sheet of copper or aluminum. Alternatively, the cooling ribbon 400 may be extruded in a conventional manner. The cooling ribbon 400 may have a plurality of contact portions 410 and end portions 412. The contact portions 410 may serve to contact the surface 212 of the core 210 and may, thus, be points where heat is transferred from the core 210 into the cooling ribbon 400. The end portions 412 may be portions of the cooling ribbon 400 that are located furthest from the surface 212 of the core 210. A plurality of inner air channels 420 may be located between the surface 212 of the core 210 and the end portions 412. A plurality of outer air channels 422 may be located between the contact portions 410 and the cooling ribbon 400.

The cooling ribbon 400 may be pressed onto the core 210 in a conventional manner. For example, in one embodiment of the heat sink 200, a single cooling ribbon 400 is pressed onto the core 210 and extends at least a portion of the length of the core 210. In another embodiment of the heat sink 200, a plurality of cooling ribbons 400 are pressed onto the heat sink 200 and extend at least a portion of the length of the core 210. Heat in the surface 212 of the core 210 transfers to the cooling ribbon 400 via the contact portions 410 where it is convected into the surrounding atmosphere. The fan, not shown in FIG. 10, may force air in the inner air channel 420 and the outer air channel 422 to increase the convection of the heat in the inner air channel 420 to the surrounding atmosphere. Air will also pass in the outer air channel 422, however, much of this air may exit the outer air channel 422 before it passes the length of the cooling ribbon 400.

In order to improve the efficiency of the cooling device 100, the shroud 350 may be placed over the heat sink 200 as was described above and as is illustrated in FIG. 11. The shroud 350 forces air in the outer air channel 422 to remain in the outer air channel 422 throughout the length of the shroud 350, which may be substantially similar to the length of the cooling ribbon 400. Accordingly, air in the outer air channel 422 is used more efficiently, which improves the overall efficiency of the cooling device 100.

In another embodiment of the heat sink 200, the cooling fins extend axially and radially along the core 210 similar to the ribbon-type cooling fin 400 of FIG. 10. More specifically, the fins may extend substantially axially and radially relative to the reference axis AA as illustrated in FIG. 1. The axially and radially extending cooling fins allow the cooling fins and the core 210 to be extruded as a single piece. Accordingly, heat transfer between the core 210 and the axially extending cooling fins is maximized. As with the other embodiments of the cooling device 100, a shroud may substantially encompass the core 210 and the cooling fins.

Referring again to FIG. 3, the fin rings 240 have been described as being adjacent to the surface 212 of the core 210. It is to be understood that the fin rings 240 may be attached to the core by numerous methods. For example, the fin rings 240 may be pressed onto the core 210. In another example, the core fin rings 240 may be soldered or brazed to the core 210.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

What is claimed is:

1. A heat sink for removing heat from a heat source, said heat sink comprising:

at least one first surface adapted to contact at least a portion of said heat source;

a core member, wherein said at least one first surface is located on said core member;

at least one outer peripheral surface located on said core member;

at least one cooling fin device having at least one inner peripheral surface and at least one cooling fin associated therewith, wherein said at least one inner peripheral surface of said cooling fin device is adjacent said at least one outer peripheral surface of said core member; and a shroud comprising a first portion and a second portion, wherein said first portion is located adjacent said at least one cooling fin, and wherein said second portion extends beyond said core member.

2. The heat sink of claim 1 wherein said second portion of said shroud has at least one slot formed therein.

* * * * *